(12) United States Patent
Cadalen et al.

(10) Patent No.: US 12,070,812 B2
(45) Date of Patent: Aug. 27, 2024

(54) METHOD FOR CONNECTION BY BRAZING ENABLING IMPROVED FATIGUE RESISTANCE OF BRAZED JOINTS

(71) Applicant: MBDA FRANCE, Le Plessis-Robinson (FR)

(72) Inventors: Eric Cadalen, Le Plessis-Robinson (FR); Mikaël Saturnin, Le Plessis-Robinson (FR)

(73) Assignee: MBDA FRANCE, Le Plessis-Robinson (FR)

( * ) Notice: Subject to any disclaimer, the term of this patent is extended or adjusted under 35 U.S.C. 154(b) by 408 days.

(21) Appl. No.: 17/291,262

(22) PCT Filed: Oct. 16, 2019

(86) PCT No.: PCT/FR2019/052448
§ 371 (c)(1),
(2) Date: May 4, 2021

(87) PCT Pub. No.: WO2020/094936
PCT Pub. Date: May 14, 2020

(65) Prior Publication Data
US 2022/0001475 A1    Jan. 6, 2022

(30) Foreign Application Priority Data
Nov. 6, 2018 (FR) ..................... 18/01162

(51) Int. Cl.
*B23K 1/00* (2006.01)
*H05K 3/34* (2006.01)
(Continued)

(52) U.S. Cl.
CPC ............. *B23K 1/0016* (2013.01); *H05K 3/34* (2013.01); *B23K 2101/42* (2018.08); *B23K 2103/08* (2018.08)

(58) Field of Classification Search
CPC ............. B23K 1/0016; B23K 2101/42; B23K 2103/08; B23K 2103/12; B23K 3/0623;
(Continued)

(56) References Cited

U.S. PATENT DOCUMENTS

| 5,906,312 A | 5/1999 | Zakel et al. |
| 2003/0089758 A1* | 5/2003 | Lee ..................... B23K 20/007 257/784 |

(Continued)

FOREIGN PATENT DOCUMENTS

| CN | 102456630 A | * 5/2012 | ............. H01L 24/11 |
| CN | 104485292 A | * 4/2015 | |

(Continued)

OTHER PUBLICATIONS

International Search Report and Written Opinion for PCT Patent Application No. PCT/FR2019/052448, mailed Feb. 6, 2020, 7 pages.

(Continued)

*Primary Examiner* — Kiley S Stoner
(74) *Attorney, Agent, or Firm* — LEWIS ROCA ROTHGERBER CHRISTIE LLP

(57) ABSTRACT

The connection method between at least two elements (E1, E2) corresponding to a printed circuit (4) and to an electronic component (5), comprises a step of forming a plurality of pad-type stacks (2) of bosses (3), the stacks (2) of bosses (3) being formed on a face (10) of a first (E1) of the elements (E1, E2), the stacks (2) of bosses (3) each comprising the same given number of bosses (3), said method also comprising a step of depositing a brazing product (7) on this first element (E1) provided with stacks (2) of bosses (3), a step of arranging the second (E2) of the elements (E1, E2) on the first element (E1), and a step of remelting the assembly thus formed, in order to obtain an electronic device (1). This (Continued)

method makes it possible to produce a precise and flexible raising of surface mounted electronic components.

18 Claims, 4 Drawing Sheets

(51) Int. Cl.
  *B23K 101/42* (2006.01)
  *B23K 103/08* (2006.01)
(58) Field of Classification Search
  CPC .. B23K 20/004; B23K 20/005; B23K 20/007; H05K 3/34; H01L 2224/11312; H01L 2224/11318; H01L 2224/1132; H01L 2224/11332; H01L 2224/1134; H01L 2224/13005; H01L 2224/13023; H01L 2224/13076; H01L 2224/1308; H01L 2224/131; H01L 2224/13139; H01L 2224/13144; H01L 2224/13147; H01L 2224/13169; H01L 2224/1329; H01L 2224/133; H01L 2224/1411; H01L 2224/81191; H01L 2224/81193; H01L 2224/81815; H01L 24/81; H01L 24/11; H01L 24/13; H01L 24/16; H01L 2924/00014; H01L 2924/014; H01L 2924/206
  USPC .......................... 228/180.22, 4.5, 180.5, 904
  See application file for complete search history.

(56) References Cited

U.S. PATENT DOCUMENTS

| 2004/0262774 | A1* | 12/2004 | Kang | ................... H01L 24/11 |
| | | | | 257/E23.021 |
| 2006/0071317 | A1* | 4/2006 | Kang | ................... H01L 24/32 |
| | | | | 257/E21.705 |
| 2007/0202680 | A1* | 8/2007 | Ismail | .................. H01L 21/561 |
| | | | | 257/E23.092 |
| 2009/0091027 | A1* | 4/2009 | Fan | ..................... H01L 25/105 |
| | | | | 257/737 |
| 2011/0156180 | A1* | 6/2011 | Chan | ..................... H01L 23/52 |
| | | | | 257/E23.141 |
| 2012/0153444 | A1* | 6/2012 | Haga | ..................... H01L 24/85 |
| | | | | 257/737 |
| 2014/0035131 | A1* | 2/2014 | Noh | ..................... H01L 24/03 |
| | | | | 257/737 |
| 2014/0124920 | A1* | 5/2014 | Chuang | ............... H01L 21/4853 |
| | | | | 257/737 |

FOREIGN PATENT DOCUMENTS

| CN | 107039369 A | * | 8/2017 | |
| CN | 109937476 A | * | 6/2019 | ............. C23C 14/34 |
| DE | 102004031920 A1 | * | 2/2005 | ........... H01L 21/563 |
| EP | 2 180 505 A2 | | 4/2010 | |
| EP | 2180505 A2 | * | 4/2010 | ........... H01L 21/561 |
| JP | H06302645 A | * | 10/1994 | |
| JP | H07297227 A | * | 11/1995 | |
| JP | H08264540 A | * | 10/1996 | |
| JP | H09219421 A | * | 8/1997 | |
| JP | H10256259 A | * | 9/1998 | |
| JP | 2003303847 A | * | 10/2003 | ............. H01L 24/05 |
| JP | 2006108408 A | * | 4/2006 | ............. H01L 24/11 |
| JP | 2008066363 A | * | 3/2008 | |
| JP | 2010034527 A | * | 2/2010 | ............. H01L 24/11 |
| JP | 2012114256 A | * | 6/2012 | ............. H01L 24/11 |
| KR | 100834804 B1 | * | 6/2008 | |
| KR | 20080062565 A | * | 7/2008 | |
| TW | 201208005 A | * | 2/2012 | ....... H01L 23/49838 |
| TW | 201312716 A | * | 3/2013 | ......... H01L 21/4853 |
| WO | WO-9748131 A1 | * | 12/1997 | ............. H01L 24/11 |
| WO | WO-2014063281 A1 | * | 5/2014 | ......... H01L 21/566 |
| WO | WO-2015153296 A1 | * | 10/2015 | ......... H01L 21/4853 |

OTHER PUBLICATIONS

Lin, et al., "Low Thermo-Mechanical Stress Flip CIP Bumps," Motorola Technical Developments, vol. 18, Motorola Inc., Schaumburg, IL, Mar. 1, 1993, pp. 76-77.

* cited by examiner

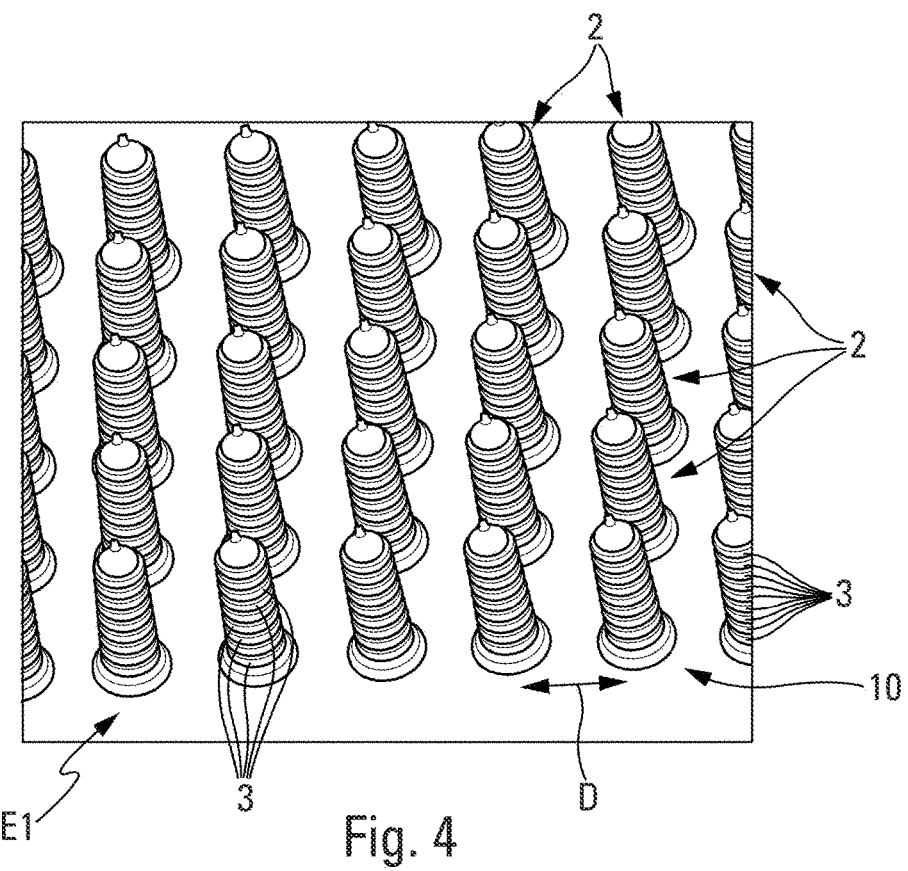
Fig. 4
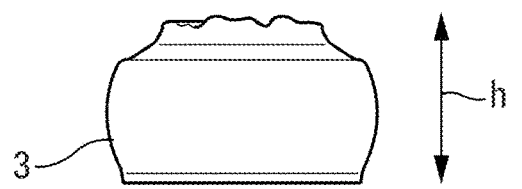
Fig. 5
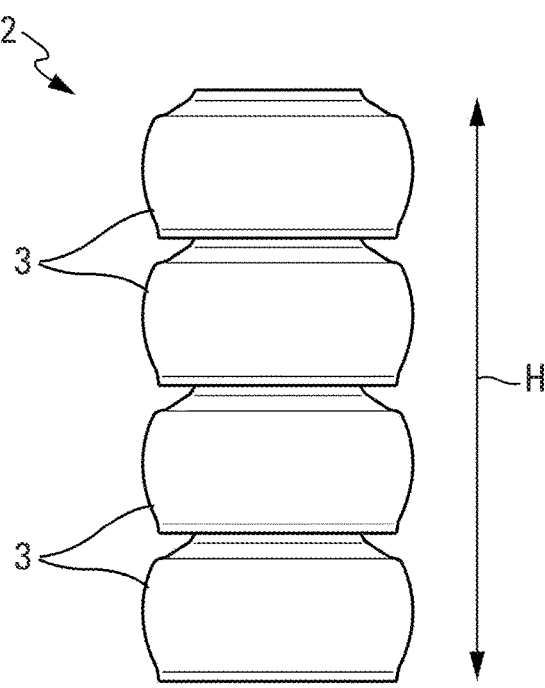
Fig. 6
Fig. 7

METHOD FOR CONNECTION BY BRAZING ENABLING IMPROVED FATIGUE RESISTANCE OF BRAZED JOINTS

CROSS-REFERENCE TO RELATED APPLICATIONS

This application is a U.S. National Phase Patent Application of International Application Number PCT/FR2019/052448, filed on Oct. 16, 2019, which claims priority to French Patent Application Number 18/01162, filed on Nov. 6, 2018, the entire contents of each of which is incorporated herein by reference.

TECHNICAL FIELD

The present invention relates to a method for connection by brazing between at least one electronic component and an electronic board or a dedicated circuit.

BACKGROUND

It is known that in various fields, in particular in the military field, more and more devices use so-called "consumer" electronic components for their manufacture, i.e. components which are accessible to the general public and generally have a low cost. Examples include QFN (Quad Flat No-leads package), BGA (Ball Grid Array) and WL CSP (Wafer Level Chip Scale Package) components (or printed circuits).

The electronic applications encountered in the military field, as well as in consumer applications, converge on four important points in electronics, namely the search for more functionality, more miniaturisation and more integration, while reducing costs.

The low-cost electronic component packages from consumer applications are therefore growing rapidly and are very widespread. They are advantageous for the four points mentioned above, but require adaptation in the military field.

Indeed, it is necessary to provide for an increase in the robustness of these components, which do not withstand the severe environments likely to be encountered in the military field, often with the appearance of cracks in the brazed joints due to thermomechanical fatigue.

In particular, these electronic components must be able to withstand a sufficient number of temperature cycles, between −55° C. and +125° C., equivalent to the operational service life of the product in which they are implanted, generally of the order of 25 years.

It is known that the parameters that influence the service life of components, mounted on a substrate, comprise in particular the height of the brazed joint. With the conventional screen printing assembly methods, the brazed joint height for some low cost components, such as QFN type packages, is of the order of 50 µm for an alloy deposit with a screen for screen printing of 150 µm. This value is the result of accumulated experience with the technology, but also of compromises related to the heterogeneity of the surface mounted components.

One of the improvements common to all components is the height of the joint to be brazed. More precisely, if the joint to be brazed height is doubled for a given component, it increases the number of cycles it can withstand by a factor of five.

Consequently, by increasing the height of the joints to be brazed, the robustness of the electronic component is greatly increased, i.e., the thermomechanical fatigue resistance of the brazed joints of components on a substrate.

Various solutions are known for increasing the height of brazed joints, such as
- the use of wedges;
- the beading of inlets/outlets;
- the optimisation of existing screen printing methods, for example by increasing the screen openings.

These standard solutions have many drawbacks. The drawbacks of these conventional solutions are related to:
- the current state of the methods, with capabilities that are at the limit of feasibility, in particular in terms of the geometry of the dimensional chain in height;
- the limitation of the integration density in current methods due to the limited ratio between the height and width of the screen printing of solder cream;
- manual or semi-automatic wedge transfer methods, which can hardly be made automatic; and
- extensive assembly controls and inspections required.

DISCLOSURE OF THE INVENTION

The purpose of this invention is to remedy at least some of these drawbacks. More precisely, it relates to a method for connection, by brazing, between at least two elements, said two elements corresponding respectively to a printed circuit and an electronic component, enabling to increase the height of the brazed joints and to improve the thermomechanical fatigue resistance of the electronic device obtained in a severe environment such as that mentioned above.

According to the invention, said connection method comprises at least the following sequence of steps:
a) a step of forming a plurality of stacks of stud bumps, said stacks of bumps being formed on a face of a first of said elements, said stacks of bumps each comprising the same given number of bumps;
b) a step of depositing a brazing product (in particular a brazing alloy) on this first element provided with the stacks of bumps or on the second element;
c) a step of arranging the second of said elements on said first element; and
d) a step of remelting the assembly thus formed in the arranging step in order to obtain a connected assembly, referred to as an electronic device in the following.

Thus, thanks to the invention, by the formation of the stacks of bumps, an elevation of one element with respect to the other is generated, which enables to increase the height of the brazed joints, and thus to increase the robustness and, more precisely, the thermomechanical fatigue resistance of the electronic device obtained after implementing said method.

Advantageously, the forming step consists in implementing thermosonic bonding. This type of bonding involves combining ultrasound, a force (or pressure) and a temperature (typically of the order of 150° C.) for a specific period of time. It does not require any filler metal, the brazing product used being used to make the bumps. More precisely, the forming step consists, for each stack of bumps, in implementing, in succession, a predetermined number of forming sub-steps, each of said forming sub-steps consisting in forming a bump, the bumps of each stack of bumps being formed in succession by being stacked on top of each other. Preferably, each forming sub-step (intended to form stud bump) comprises at least the following steps:
- an operation of heating a metal wire by means of an electrode;

an operation of depositing a metal ball formed at the end of the heated metal wire;

an operation of crushing and welding the metal ball; and an operation of separating the metal wire from the crushed metal ball to form the bump.

Advantageously:

each bump has a height of between 20 μm and 30 μm for a metal wire of typically 25 μm in diameter. The height can be controlled to an extreme micrometre accuracy lower than the micrometer, reproducible and repeatable with automatic equipment; and/or each stack of bumps has a height of between 110 μm and 150 μm for the strength gain typically aimed for (between 80 and 200 depending on the number of breakage cycles the component must withstand); and/or at least some of said stacks of bumps are separated from each other by a distance of between 0.05 mm and 0.1 mm, on said first element.

Furthermore, advantageously, the bumps are made of one of the following materials: copper, gold, silver or platinum, and preferably of copper or silver, in particular to match the material used for the brazing.

In a particular embodiment, the method comprises a plurality of sequences of steps, each of these sequences of steps enabling to connect an electronic component onto the same printed circuit so as to obtain an electronic device comprising a printed circuit provided with a plurality of electronic components.

For the purpose of this invention, said first element on which the stacks of bumps are formed may be either the printed circuit or the electronic component.

Thus:

in a first embodiment, said first element corresponds to the printed circuit board, and said second element corresponding to the electronic component; and in a second embodiment, said first element corresponds to the electronic component, and said second element corresponds to the printed circuit.

This invention thus allows to improve the fatigue life of brazed joints by modifying the interconnection of a component on a substrate. More particularly, said method allows for precise and flexible elevation for surface mounted electronic components.

The present invention also relates to an electronic device (formed by at least one electronic component such as an integrated circuit, connected (by means of brazing) to a printed circuit board) which is obtained by implementing a method such as that described above.

BRIEF DESCRIPTION OF THE FIGURES

The attached figures will make it clear how the invention can be implemented. In these figures, identical references denote similar elements. More particularly:

FIG. 4 is a schematic perspective view of a plurality of stacks of bumps;

FIG. 5 is a schematic view of a stud bump implemented from thermosonic bonding;

FIG. 6 shows a stack of two bumps such as that shown in FIG. 5;

FIG. 7 shows a stack of four bumps as in FIG. 5;

DETAILED DESCRIPTION

Figure 1:
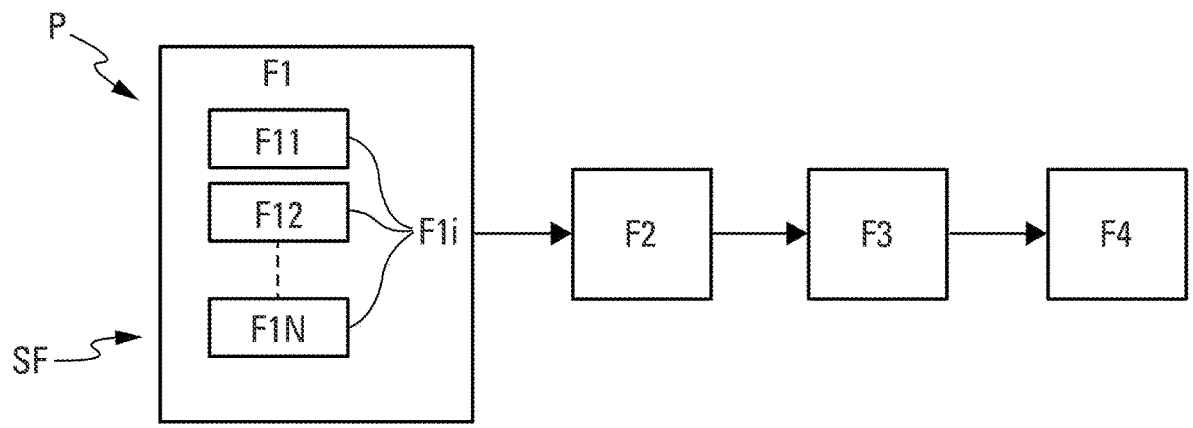
FIG. 1 is a block diagram of a connection method according to the invention.
Figure 2:
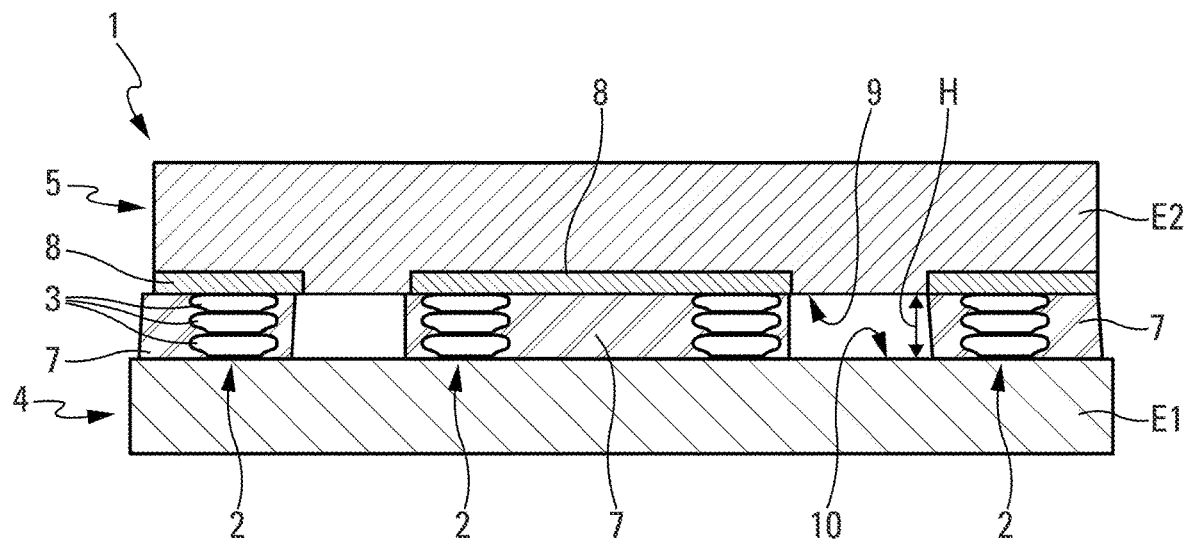
FIG. 2 is a schematic cross-sectional view of a connection according to the invention between a printed circuit and an electronic component.
Figure 3:
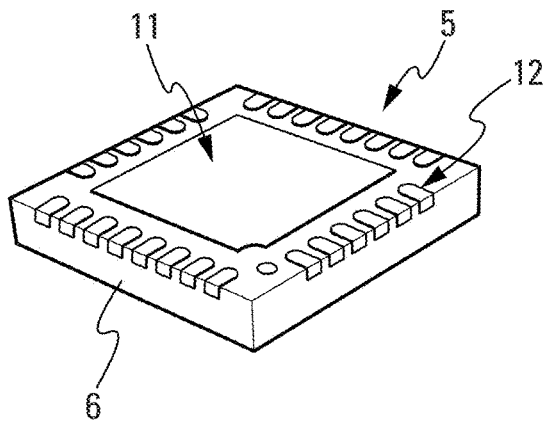
FIG. 3 is a perspective view of an example of an electronic component suitable for connection to a printed circuit board.

The method P illustrating the invention and shown schematically in FIG. 1 is a connection method (implementing a brazing) in the field of electronic assembly to generate a connection between at least two elements E1 and E2, as shown in FIG. 2.

These two elements E1 and E2 correspond, one to a printed circuit 4 (or PCB type (Printed Circuit Board)), and the other to an electronic component 5.

This electronic component 5 may, in particular, be a printed circuit 6 of the QFN type (for "Quad Flat No-leads package") as shown in FIG. 2, of the BGA type ("Ball Grid Array"), or of the WL CSP type (for "Wafer Level Chip Scale Package").

Figure 9:
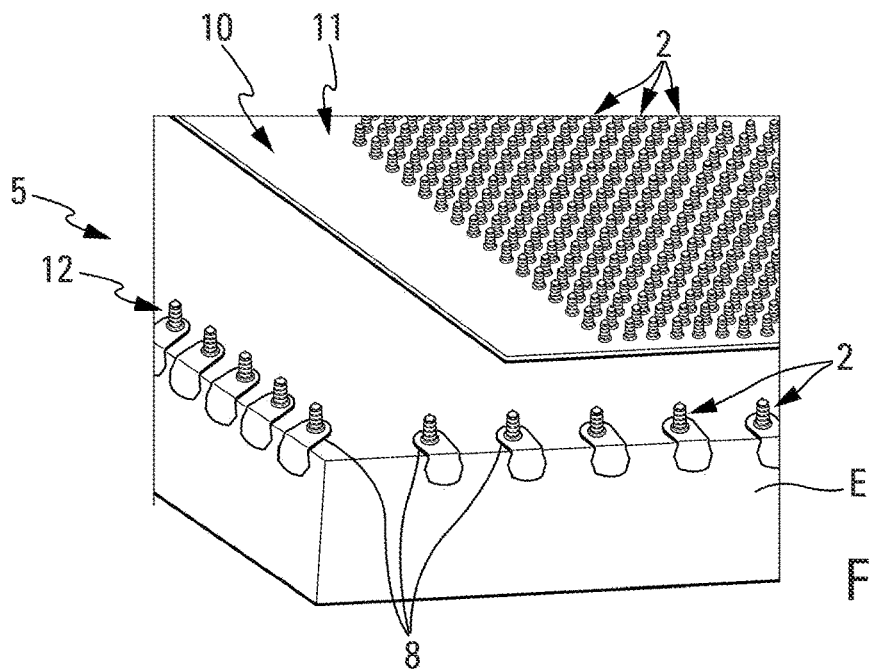
FIG. 9 is a partial perspective view of an electronic component provided with a plurality of stacks of bumps.

According to the invention, said method P comprises, as shown in FIG. 1, at least the following sequence of steps SF:

a forming step F1, by thermosonic bonding, consisting of forming a plurality of stacks 2 of bumps 3. These stacks 2 (of bumps 3) are formed on a face 10 of a first E1 of said elements, as shown in FIG. 4. This first element E1 may be either the printed circuit 4 (as shown in FIG. 2) or the electronic component 5 (as shown in FIG. 9), depending on the embodiment to be conceived. Each of the stacks 2 comprises the same given (and predetermined) number N of bumps 3, N being an integer, as illustrated in FIG. 6 (where N is equal to 2) and FIG. 7 (where N is equal to 4). The bumps 3 are of the stud bumps, as shown for the bump 3 represented in FIG. 5;

a depositing step F2 consisting of depositing, in the usual way, an electrically conductive brazing product 7 (FIG. 2) in the form of a paste, in particular a brazing alloy, on this first element E1 provided with the stacks 2 formed in the forming step F1. An electrically conductive adhesive based on epoxy resin may also be used. By way of illustration, the deposition can be carried out by screen printing, by dispensing solder cream with a syringe, or by jetting micro-droplets of solder cream. It is also possible to conceive a thermosonic bonding step F1 on the element E2 combined with a depositing step F2 in the usual way on the element E1;

a arranging step F3 consisting of arranging, in the usual way, the other element E2 (i.e., the second E2 of said elements E1 and E2) on said first element E1, by bringing it into contact with one 9 of its faces (at the level of ranges 8) of the stacks 2 arranged on the face 10 of the first element E1, as shown in FIG. 2; and at least one remelting step F4 consisting of implementing, in the usual way, a remelting of the assembly thus formed (in the arranging step F3) in order to finally obtain an electronic assembly referred to hereinafter as the electronic device 1 (FIG. 2). This remelting is implemented at a limited temperature, of the order of 240° C.

Thus, thanks to the method P, an elevation is generated at the forming step F1 by the installation of stacks 2 of stud bumps 3, which enables to increase the height of the brazed joints of the first element E1 with respect to the second element E2, thus enabling to increase the robustness and, more precisely, the thermo-mechanical fatigue resistance of the electronic device 1 obtained after carrying out said method P.

This method P enables to improve the behaviour in a severe environment (as mentioned above) for "consumer" components. More particularly, the electronic device 1 thus formed is able to withstand a number of temperature cycles, between −55° C. and +125° C., over a period of about 25 years, as required in the military field.

The forming step F1 consists, for each stack 2 of bumps 3, in implementing, successively, a predetermined number N of forming sub-steps F1$i$, $i$ varying from 1 to N.

Each of said successive forming sub-steps F11, F12, . . . , to F1N (FIG. 1) consists of forming a single bump 3, for example such as that shown in FIG. 5. The bumps 3 of each stack 2 are formed, successively, one after the other by being stacked on top of each other.

By way of illustration, in FIG. 6, a stack 2 of two bumps 3 is shown, and in FIG. 7, a stack 2 of four bumps 3 is shown.

Figures 8A, 8B, 8C:
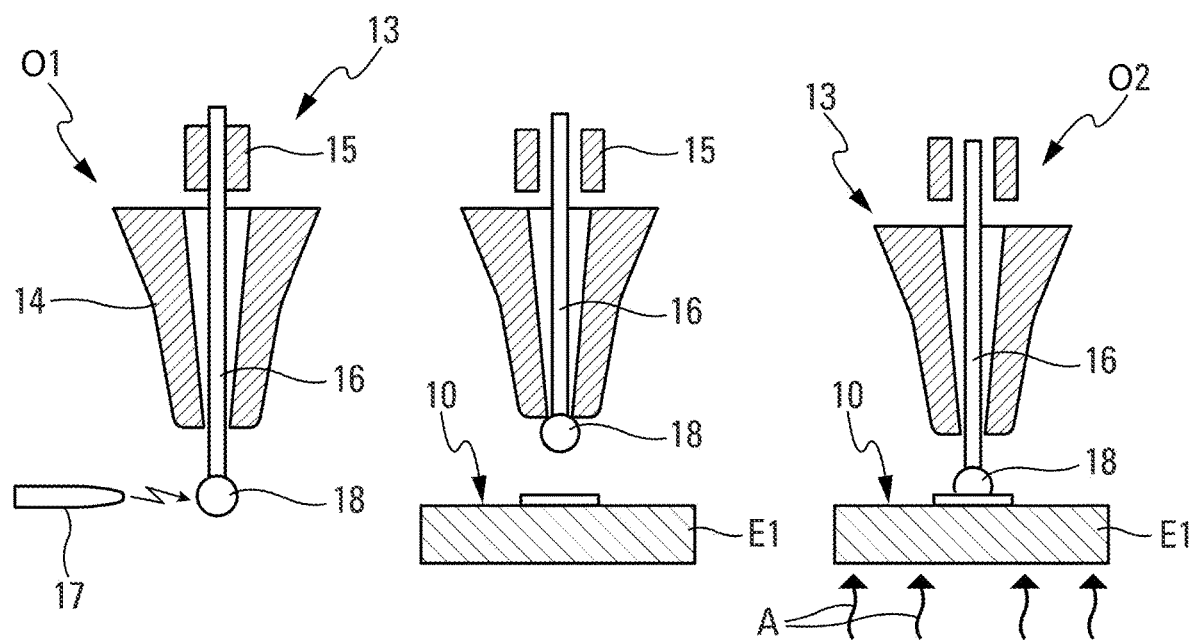
FIGS. 8A to 8E show schematically different successive operations of a sub-step of forming a stud bump made by thermosonic bonding.
Figures 8D, 8E:
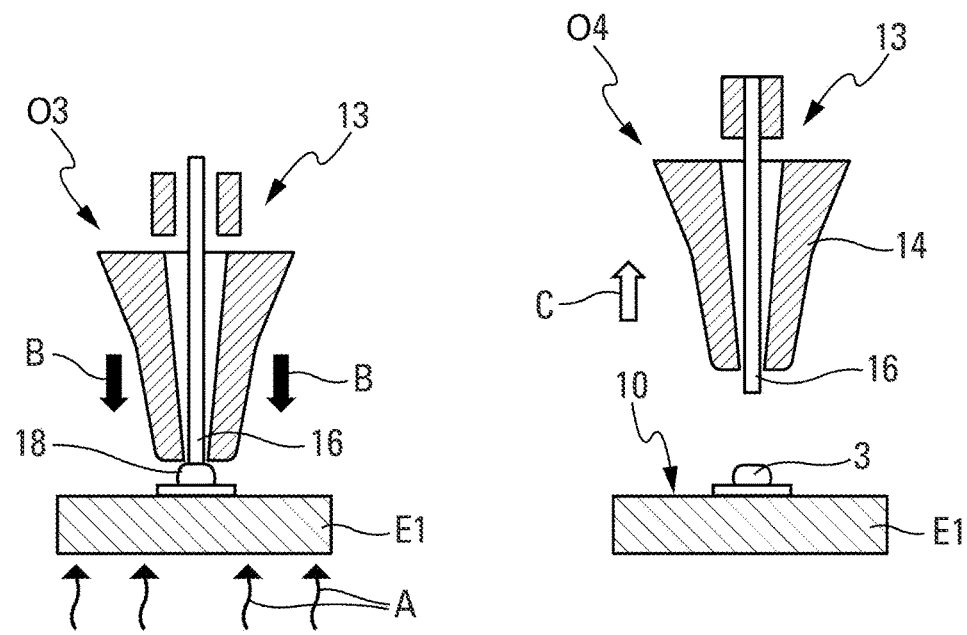

To this end, in a preferred embodiment, each forming step F1$i$, by thermosonic bonding, is carried out, as shown in FIGS. 8A to 8E, the following operations, using a tool 13 comprising a capillary body 14 and a gripping element 15 such as a clamp:
- an heating operation O1 consisting of heating a metal wire 16 held in the tool 13, via an electrode 17, as shown in FIG. 8A so as to form a metal ball 18. The wire 16 is made of the metal to be used for the bump to be formed;
- an depositing operation O2 consisting of depositing the metal ball 18 formed at the end of the heated metal wire 16, on the face 10 of the element E1 when it is the first bump of the stack, as shown in FIGS. 8B (in which the gripping element 15 releases the metal wire 16 which rises) and 8C (which illustrates the deposition), or on another bump already formed on this face 10. The element E1 is subjected to heating, illustrated by arrows A. FIG. 6 shows, by way of illustration, the formation of a bump 3 on another bump 3 already formed, with deposition in the direction illustrated by an arrow G. An ultrasonic energy supply may also be provided;
- an crushing and welding operation O3 consisting of generating a force (illustrated by arrows B in FIG. 8D), a temperature of typically 150° C. as well as ultrasound on the metal ball 18, using a part of the preferably ceramic tool 13, so as to flatten it slightly as shown in FIG. 8D; and
- an separating operation O4 consisting of separating the metal wire 16 from the crushed metal ball 18 and withdrawing the tool 13 (in the direction illustrated by an arrow C in FIG. 8E, with the metal wire 16 being held by the gripping element 15) so as to form the bump 3. The breaking of the metal wire 16 to form the bump 3 takes place at a thermally affected zone.

For the purpose of the present invention:
each bump 3 preferably has a height h (shown in FIG. 5) which is between 20 μm and 30 μm;

a very varied number N of bumps 3 per stack 2 can be provided, for example from 2 to 30 bumps per stack and preferably from 3 to 6 bumps per stack.

Thus, by way of illustration, each stack 2 of bumps 3 preferably has a height H (shown in FIGS. 2 and 7) which is between 110 am and 150 μm.

Furthermore, with the aforementioned method P, it is possible to bring the stacks 2 close to each other at a short distance, if this is necessary or desired in the forming step F1. By way of example, it is conceivable that at least some of the stacks 2 of bumps are separated from each other, on said first element E1, by a distance D (shown in FIG. 4) which is between 0.05 mm and 0.1 mm. These characteristics can be adapted according to the matrix of the component as well as the number of breakage cycles that the component must withstand.

In a particular embodiment, the bumps 3 are made of one of the following materials: copper, gold, silver or platinum. Preferably, however, said bumps 3 are made of copper or silver so as to allow better cohesion with the brazing product 7 and avoid dissolution (in the case of gold) of the bump by the brazing.

The method P and in particular the forming step F1 can be integrated into standard brazing connection methods. Thus, in particular the depositing step F2 can be implemented in a standard way.

Therefore, the method P, as described above:
- is flexible and adaptable;
- is not limited by the pitch (or distance) of the inputs/outputs (distance D between the inputs/outputs);
- can be carried out with precise and wide control of the height variation range, with for example 2 to 30 levels of stacked bumps 3 (per stack of bumps); and
- enables to limit the thermal stresses for the elements E1 and E2 during the assembly phases.

The thermal stresses undergone while carrying out the method are limited, with a maximum temperature of the order of 150° C. during the thermosonic bonding step F1.

In a particular embodiment (not shown), the method P comprises a plurality of sequences of steps SF. Each of these sequences of steps SF is intended to connect another electronic component on the same printed circuit. This enables to obtain an electronic device comprising a single printed circuit provided with a plurality of electronic components.

Figure 10:
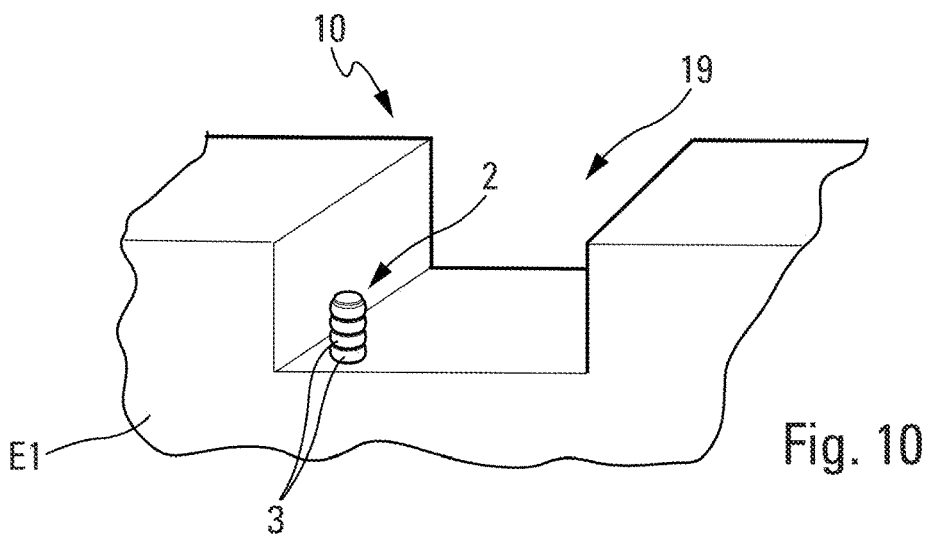
FIG. 10 is a schematic partial perspective view of an element provided with a cavity for receiving stacks of bumps.
Figure 11:
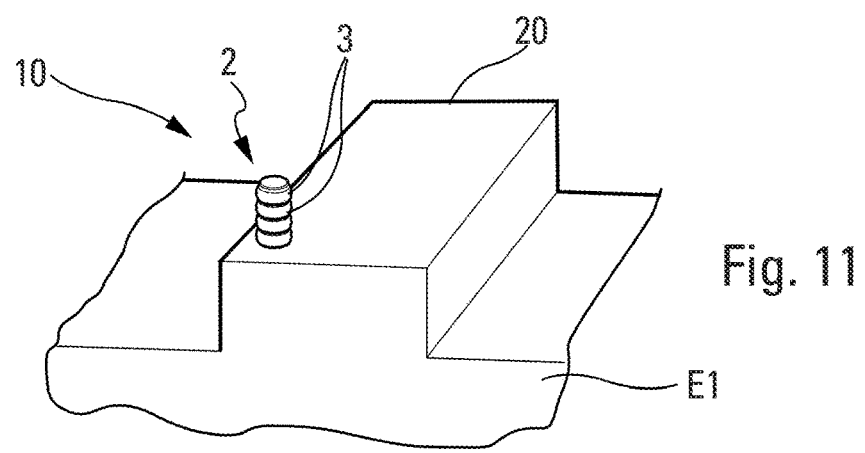
FIG. 11 is a schematic partial perspective view of an element having a raised base for receiving stacks of bumps.

Furthermore, thanks to the embodiment of the method P, the bumps 3 (and thus the element E2) can thus be arranged on an element E1, the face 10 of which has a substantially flat shape, as shown in FIG. 9. Moreover, the method P as described above also allows to form, in an advantageous way, stacks 2 of bumps 3 on an element E1, the face 10 of which is not flat, in particular, at the level of a cavity 19 of this element E1 as shown in FIG. 10 or at the level of a raised base 20 of this element E1 as shown in FIG. 11. For the sake of simplicity of the drawings, only one of the plurality of stacks 2 of bumps 3 is shown in FIGS. 10 and 11. In these situations in FIGS. 10 and 11, the element E2 is therefore arranged in the cavity 19 or on the base 20.

As indicated above, for the purpose of the present invention, said first element E1 on which the stacks 2 of bumps 3 are formed may be either the printed circuit board 4 or the electronic component 5.

Thus:
- in a first embodiment, as shown in FIG. 2, said first element E1 corresponds to the printed circuit 4, and said second element E2 corresponding to the electronic component 5; and in a second embodiment, said first element E1 corresponds to the electronic component 5 (FIG. 9), and said second element E2 corresponding to the printed circuit.

With method P, there is great freedom and therefore flexibility regarding the number and location of the stacks on the element E1. In particular, as illustrated in FIG. 9, when the element E1 is an electronic component 5, the stacks 2 may in particular be formed on the central part 11 of the face 10 of the electronic component 5 and/or on the periphery 12 of this face 10.

The stack 2 of bumps 3 on an element E1, for example on an electronic component 5 such as an integrated circuit, thus enables to raise it and to obtain a maximum of brazing under this element E1. This stack 2 thus increases the height of the brazed joint (obtained in steps F3 and F4 using the brazing product 7) and improves the thermomechanical fatigue resistance of the electronic device 1.

Thus, thanks to the invention, a method P is obtained which is:
flexible:
in height, by choosing an appropriate height H per stack 2;
in positioning on the element E1, with, for example, a formation of stacks 2 on heat dissipation ranges or on inputs/outputs of the element E1;
in the number of stacks 2. By way of illustration, several thousand stacks 2 can be provided per element E1, in particular per electronic component 5; and
adaptable. This method P can be integrated into standard brazing connection methods, and is adaptable according to the applications related to the electronic component and the printed circuit.

This method P can be implemented via automatic equipment and standard methods existing in the field of consumer electronics.

Furthermore, there is a possibility of isostatic formation of three stacks of bumps or hyperstatic formation of a large number of stacks of bumps.

Furthermore, said method P has no impact on repairs, and is adaptable to any type of stack distribution (or design).

Furthermore, the method P is in particular applicable to electronic components having:
Bottom Terminations Components (BTC), for example QFN, DFN, or LCC;
Ball Terminations in arrays, e.g. BGA or flip chip;
Area terminations under the component, e.g. LGA.

The method P as described above, which is thus based on the formation of stacks 2 of bumps 3, has, in particular, the following features and advantages:
a microelectronic precision adaptable to existing and future needs (distance (or pitch) D of 0.05 mm for example);
a temperature to which the electronic component in particular is subjected, which is reduced, of the order of 150° C. during the thermosonic bonding;
a repeatability of the geometry by automating the method;
a self-controlled method;
flexibility;
controlled cost; and
increased integration density.

This method is therefore mainly suitable for improving the fatigue life of the brazed joints. However, due to the high accuracy, this method can also perform specific secondary alignment functions (optical function alignment, three-axis function alignment, . . . ).

The invention claimed is:

1. A method for connection, by brazing, between at least two elements, said two elements corresponding respectively to a printed circuit and to an electronic component, the method characterised in that it comprises at least the following sequence of steps:
   a) a step of forming a plurality of stacks of stud bumps, said plurality of stacks of stud bumps being formed on a face of a first element of said two elements, said plurality of stacks of stud bumps each comprising the same given number of bumps;
   b) a step of depositing a brazing product on the first element provided with the plurality of stacks of stud bumps or on a second element of the said two elements;
   c) a step of arranging the second element on said first element; and
   d) a step of remelting, by brazing, the brazing product thus formed in the arranging step to create at least one brazed joint between the first element and the second element, in order to obtain an electronic device,
   wherein the brazing product directly contacts the face of the first element after the remelting step, and
   wherein the forming step consists, for each stack of stud bumps of the plurality of stacks of stud bumps, in implementing, in succession, a predetermined number of forming sub-steps, each of said forming sub-steps consisting in forming a bump, the bumps of the stack of stud bumps being formed in succession by being stacked on top of each other.

2. The method according to claim 1, characterised in that each forming sub-step comprises at least the following operations:
   an operation of heating of a metal wire by means of an electrode;
   an operation of depositing a metal ball formed at an end of the heated metal wire;
   an operation of crushing and welding the metal ball; and
   an operation of separating the metal wire from the crushed metal ball to form the bump.

3. The method according to claim 1, characterised in that each bump has a height of between 20 μm and 30 μm.

4. The method according to claim 1, characterised in that each stack of stud bumps of the plurality of stacks of stud bumps has a height of between 110 μm and 150 μm.

5. The method according to claim 1, characterised in that at least some of said plurality of stacks of stud bumps are separated from each other by a distance of between 0.05 mm and 0.1 mm on said first element.

6. The method according to claim 1, characterised in that the bumps are made of one of the following materials: gold, copper, silver, platinum.

7. The method according to claim 1, characterised in that it comprises a plurality of sequences of steps, each of these sequences of steps enabling to connect an electronic component onto the same printed circuit so as to obtain an electronic device comprising a single printed circuit provided with a plurality of electronic components.

8. The method according to claim 1, characterised in that said first element corresponds to the printed circuit, and said second element corresponds to the electronic component.

9. The method according to claim 1, characterized in that said first element corresponds to the electronic component, and said second element corresponds to the printed circuit.

10. An electronic device, characterised in that it is obtained by implementing the method according to claim 1.

11. The method according to claim 1, wherein the brazing product is deposited on the second element.

12. The method according to claim 1, wherein a brazed joint of the at least one brazed joint extends between a pair of adjacent ones of the plurality of stacks of stud bumps.

13. The method according to claim 1, wherein the bumps are made of copper.

14. The method according to claim 1, wherein the bumps are made of silver.

15. The method according to claim 1, wherein the bumps are made of a material that matches a material of the brazing product.

16. The method according to claim 1, wherein the second element directly contacts the plurality of stacks of stud bumps.

17. The method according to claim 1, wherein the brazing product directly contacts the second element after the remelting step.

18. The method according to claim 1, wherein a stack of stud bumps of the plurality of stacks of stud bumps directly contacts both the first element and the second element, and extends continuously between the first element and the second element, after the remelting step.

* * * * *